(12) United States Patent
Choi et al.

(10) Patent No.: US 12,074,572 B2
(45) Date of Patent: Aug. 27, 2024

(54) PROTECTION CIRCUIT IN ELECTRONIC DEVICE AND METHOD THEREFOR

(71) Applicant: Samsung Electronics Co., Ltd., Gyeonggi-do (KR)

(72) Inventors: Hyunseok Choi, Gyeonggi-do (KR); Jooseung Kim, Gyeonggi-do (KR); Jihoon Kim, Gyeonggi-do (KR); Hyoseok Na, Gyeonggi-do (KR); Sanghun Sim, Gyeonggi-do (KR); Namjun Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 642 days.

(21) Appl. No.: 17/263,044

(22) PCT Filed: Oct. 30, 2020

(86) PCT No.: PCT/KR2020/015021
§ 371 (c)(1),
(2) Date: Jan. 25, 2021

(87) PCT Pub. No.: WO2021/086105
PCT Pub. Date: May 6, 2021

(65) Prior Publication Data
US 2022/0337200 A1 Oct. 20, 2022

(30) Foreign Application Priority Data
Oct. 30, 2019 (KR) .......................... 10-2019-0136596

(51) Int. Cl.
*H03F 1/52* (2006.01)
*H02H 3/087* (2006.01)
*H03F 3/24* (2006.01)

(52) U.S. Cl.
CPC ............... *H03F 1/52* (2013.01); *H02H 3/087* (2013.01); *H03F 3/245* (2013.01); *H03F 2200/462* (2013.01)

(58) Field of Classification Search
CPC ........................................................ H03F 1/52
(Continued)

(56) References Cited

U.S. PATENT DOCUMENTS 7,683,712 B2 3/2010 Suzakl et al.
8,487,705 B2 * 7/2013 Yao .......................... H03F 1/52
330/207 P (Continued)

FOREIGN PATENT DOCUMENTS

CN 102185566 3/2013
EP 2 051 370 4/2009

(Continued)

OTHER PUBLICATIONS

European Search Report dated Aug. 13, 2021 issued in counterpart application No. 20841845.9-1203, 15 pages.
(Continued)

*Primary Examiner* — Henry Choe
(74) *Attorney, Agent, or Firm* — The Farrell Law Firm, P.C.

(57) ABSTRACT

An electronic device and method thereof of are provided to prevent burnout due to overcurrent. An electronic device includes a power amplifier configured to amplify a transmission signal; a battery configured to provide a bias voltage to the at least one power amplifier; and an overcurrent protection circuit configured to prevent overcurrent from flowing through the power amplifier. The overcurrent protection circuit includes a configurer configured to configure a reference current value, based on the power amplifier; a measurer configured to measure a bias current value due to (Continued)

the bias voltage; a comparator configured to compare the measured bias current value with the reference current value; and a controller configured to recognize overcurrent flowing through the power amplifier and control provision of the bias voltage, based on a result of the comparison.

20 Claims, 11 Drawing Sheets

(58) Field of Classification Search
USPC .............................................. 330/207 P, 298
See application file for complete search history.

(56) References Cited

U.S. PATENT DOCUMENTS

| | | | |
|---|---|---|---|
| 9,817,416 | B2 | 11/2017 | Gebeyehu et al. |
| 10,075,073 | B2* | 9/2018 | Guan ........................ G05F 1/46 |
| 10,951,178 | B2* | 3/2021 | Ripley .................. H03F 1/0211 |
| 11,646,701 | B2* | 5/2023 | Ripley .................... H03F 3/245 |
| | | | 330/296 |
| 2008/0247099 | A1* | 10/2008 | Hojo ........................ G05F 1/573 |
| | | | 361/18 |
| 2011/0292554 | A1 | 12/2011 | Yao et al. |
| 2012/0139645 | A1 | 6/2012 | Ho et al. |
| 2014/0368277 | A1 | 12/2014 | Ding et al. |
| 2017/0048007 | A1 | 2/2017 | Lee et al. |
| 2017/0070149 | A1* | 3/2017 | Guan ....................... H02M 1/36 |

FOREIGN PATENT DOCUMENTS

| | | |
|---|---|---|
| JP | 2008-271517 | 11/2008 |
| JP | 2010-220394 | 11/2010 |
| JP | 2018-106286 | 7/2018 |
| KR | 1020060127070 | 12/2006 |
| KR | 1020150123712 | 11/2015 |
| KR | 1020170019710 | 2/2017 |

OTHER PUBLICATIONS

EP Result of Consultation dated Mar. 1, 2023 issued in counterpart application No. 20841845.9, 5 pages.
International Search Report dated Feb. 18, 2021 issued in counterpart application No. PCT/KR2020/015021, 14 pages.
Indian Examination Report dated Aug. 17, 2022 issued in counterpart application No. 202117003851, 6 pages.
Chinese Office Action dated Oct. 24, 2023 issued in counterpart application No. 202080005837.9, 21 pages.
European Search Report dated Jan. 29, 2024 issued in counterpart application No. 23201251.8-1205, 13 pages.

* cited by examiner

PROTECTION CIRCUIT IN ELECTRONIC DEVICE AND METHOD THEREFOR

PRIORITY

This application is a National Phase Entry of International Application No. PCT/KR2020/015021, which was filed on Oct. 30, 2020, and claims priority to Korean Patent Application No. 10-2019-0136596, filed in the Korean Intellectual Property Office on Oct. 30, 2019, the contents of each of which is incorporated herein by reference.

TECHNICAL FIELD

The disclosure relates generally to a protection circuit configured to prevent burnout due to overcurrent in an electronic device, and a method for the same.

BACKGROUND ART

Mobile electronic devices often include batteries. A battery may supply voltage or current to various elements of an electronic device. An electronic device, e.g., a smart phone or a tablet personal computer (PC), may support wireless communication.

An electronic device supporting wireless communication may include at least one element for transmitting or receiving radio frequency (RF) signals. e.g., one or more antennas and/or an RF-front end (RFFE) circuit. The RFFE circuit may correspond to a module in which input/output signal processing parts for transmitting/receiving RF signals are integrated in an electronic device supporting wireless communication.

DISCLOSURE OF INVENTION

Technical Problem

An RFFE circuit may include a switch for switching between transmission/reception paths, a reception filter and a low-noise amplifier (LNA) for reception, and/or a power amplifier (PA) for transmission. The RFFE circuit may reduce the number of components constituting the electronic device or loss due to connections between components.

The RFFE circuit may receive operation power from a battery of the electronic device. For stable operation of the RFFE circuit, a constant level of voltage or current should be supplied from the battery. For example, if there is no change in the internal resistance of the electronic device, a constant level of voltage may cause a constant level of current to flow through the internal resistance. However, if there is a change in the internal resistance of the electronic device, excessive voltage (hereinafter, referred to as "overvoltage") may cause excessive current (hereinafter, referred to as "overcurrent") to flow through the internal resistance.

If overvoltage is instantaneously supplied from the battery to the RFFE circuit, overcurrent may flow through an integrated circuit (IC) of the RFFE circuit. The overcurrent may interrupt normal operation of the IC of the RFFE circuit, or may burn out or damage the RFFE circuit. For example, the overvoltage or the overcurrent may be a major cause for damaging or burning out power amplifiers of the RFFE circuit.

The present disclosure has been made to address the above-mentioned problems and disadvantages, and to provide at least the advantages described below.

An aspect of the disclosure is to provide a protection circuit, and a method therefor, which prevent the supply of excessive current (or voltage) to an RFFE circuit in an electronic device.

Another aspect of the disclosure is to provide an overcurrent protection circuit, and a method therefor, for preventing burnout of a power amplifier due to overcurrent in an electronic device.

Another aspect of the disclosure is to provide an overcurrent protection circuit, and a method therefor, that prevent burnout of power amplifiers by implementing a limit current in an electronic device including power amplifiers having various characteristics.

Solution to Problem

In accordance with an aspect of the disclosure, an electronic device is provided, which includes a power amplifier configured to amplify a transmission signal; a battery configured to provide a bias voltage to the at least one power amplifier; and an overcurrent protection circuit configured to prevent overcurrent from flowing through the power amplifier, the overcurrent protection circuit includes a configurer configured to configure a reference current value, based on the power amplifier; a measurer configured to measure a bias current value due to the bias voltage; a comparator configured to compare the measured bias current value with the reference current value; and a controller configured to recognize overcurrent flowing through the power amplifier and control provision of the bias voltage, based on a result of the comparison.

In accordance with another aspect of the disclosure, an electronic device is provided, which includes a power amplifier configured to amplify a transmission signal; a battery configured to provide a voltage for driving the power amplifier; and an overcurrent protection circuit configured to shut off or limit the supply of power from the battery to the power amplifier if overcurrent, which may burn out the power amplifier, is recognized. The overcurrent protection circuit includes a configurer configured to configure a reference current value, based on the power amplifier to which a driving voltage Vcc is being supplied or is to be supplied from the battery; a current measurer configured to measure the current supplied by the driving voltage; a comparator configured to compare the measured current with the reference current value; and a controller configured to determine that the power amplifier is in an overcurrent state, based on the comparison result, and if it is determined that the power amplifier is in an overcurrent state, transmit a control signal for shutting off or limiting the supply of the driving voltage to the driving power source.

In accordance with another aspect of the disclosure, an operation method is provided for an electronic device. The operation method includes determining a power amplifier to which a bias voltage and a driving voltage are to be supplied, among a plurality of power amplifiers included in the electronic device; obtaining a maximum permissible current value according to the determined power amplifier; and configuring a reference current value of an overcurrent protection circuit, based on the obtained maximum permissible current value.

Various respective aspects and features of the invention are defined in the appended claims. Combinations of features from the dependent claims may be combined with features of the independent claims as appropriate and not merely as explicitly set out in the claims.

Furthermore, one or more selected features of any one embodiment described in this disclosure may be combined with one or more selected features of any other embodiment described herein, provided that the alternative combination of features at least partially alleviates the one or more technical problem discussed in this disclosure or at least partially alleviates a technical problem discernable by the skilled person from this disclosure and further provided that the particular combination or permutation of embodiment features thus formed would not be understood by the skilled person to be incompatible.

Two or more physically distinct components in any described example implementation of this disclosure may alternatively be integrated into a single component where possible, provided that the same function is performed by the single component thus formed. Conversely, a single component of any embodiment described in this disclosure may alternatively be implemented as two or more distinct components to achieve the same function, where appropriate.

It is an aim of certain embodiments of the invention to solve, mitigate or obviate, at least partly, at least one of the problems and/or disadvantages associated with the prior art. Certain embodiments aim to provide at least one of the advantages described below.

BEST MODE FOR CARRYING OUT THE INVENTION

Hereinafter, various embodiments will be described in detail with reference to the accompanying drawings. In the following description, specific details such as detailed configuration and components are merely provided to assist the overall understanding of these embodiments of the disclosure. Therefore, it should be apparent to those skilled in the art that various changes and modifications of the embodiments described herein can be made without departing from the scope and spirit of the disclosure. In addition, descriptions of well-known functions and constructions are omitted for clarity and conciseness.

Figure 1:
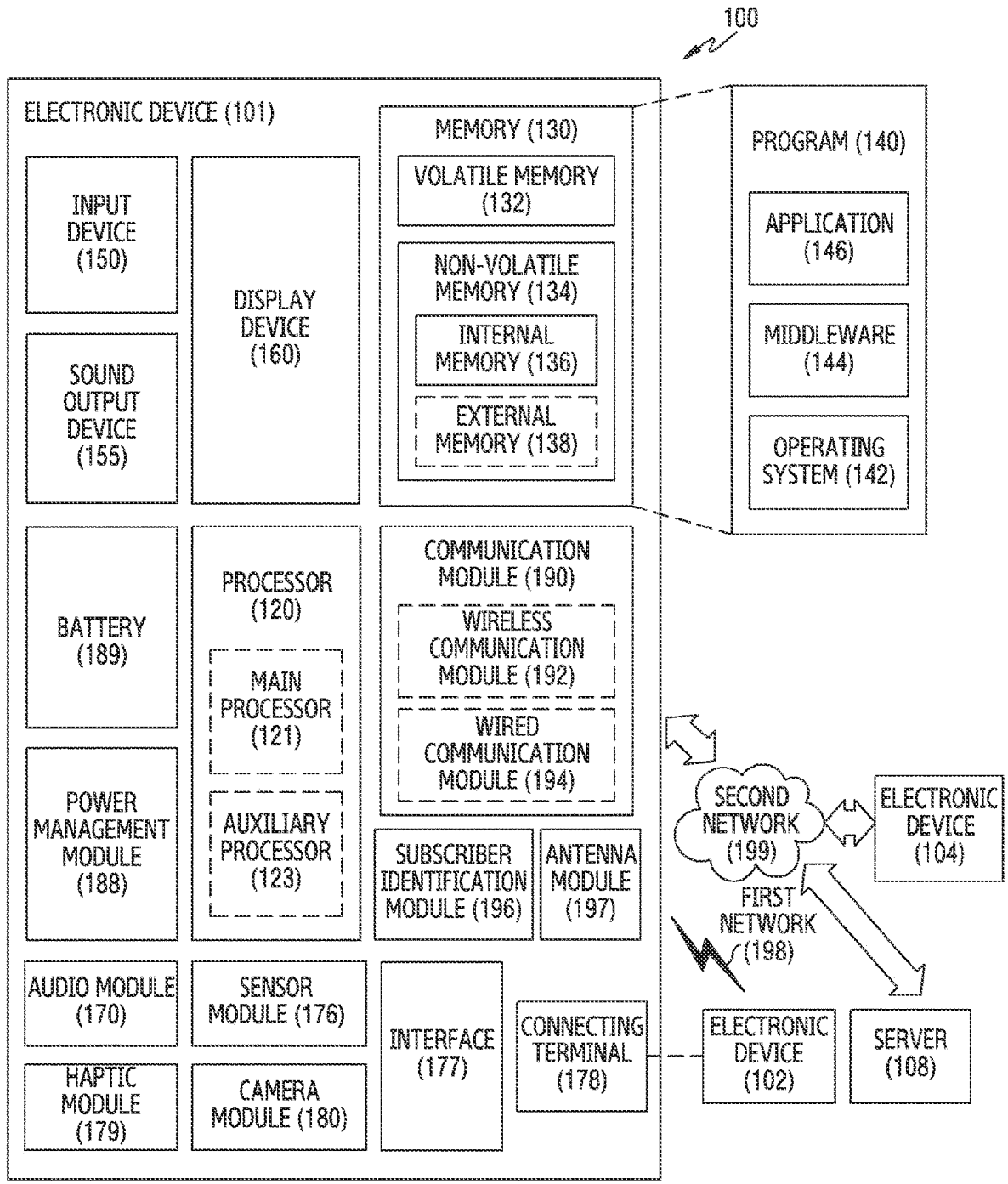
FIG. 1 illustrates an electronic device in a network environment according to an embodiment.

FIG. 1 illustrates an electronic device in a network environment according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, and an antenna module 197. Alternatively, at least one of the components (e.g., the display device 160 or the camera module 180) may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 includes a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121. The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include software (e.g., the program 140) and input data or output data for a command related thereto. The memory 130 includes the volatile memory 132 and the non-volatile memory 134.

The program 140 may be stored in the memory 130 as software, and includes, for example, an operating system (OS) 142, middleware 144, or an application 146.

The input device 150 may receive a command or data to be used by another component of the electronic device 101 (e.g., the processor 120), from the outside (e.g., a user) of the electronic device 101. The input device 150 may include a microphone, a mouse, a keyboard, and/or a digital pen (e.g., a stylus pen).

The sound output device 155 may output sound signals to the outside of the electronic device 101. The sound output device 155 may include a speaker or a receiver. The speaker may be used for general purposes, such as playing multimedia or playing record, and the receiver may be used for an incoming calls. The receiver may be implemented as separate from, or as part of the speaker.

The display device 160 may visually provide information to the outside (e.g., a user) of the electronic device 101. The display device 160 may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include a motor, a piezoelectric element, or an electric stimulator.

The camera module 180 may capture a still image or moving images. The camera module 180 may include one or more lenses, image sensors, ISPs, or f lashes.

The power management module 188 may manage power supplied to the electronic device 101. The power management module 188 may be implemented as at least part of a power management IC (PMIC).

The battery 189 may supply power to at least one component of the electronic device 101. The battery 189 may include a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module).

A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet. or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency IC (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device may be one of various types of electronic devices. An electronic devices may include a portable communication device (e.g., a smartphone), a computer device, a portable multimedia device, a portable medical device, a camera, a wearable device, or a home appliance. However, the electronic devices are not limited to the examples described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A. B, and C," and "at least one of A, B. or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic." "logic block." "part," or "circuitry". A module may be a single integral component, or a minimum unit or part thereof, adapted to perform one or more functions. For example, according to an embodiment, the module may be implemented in a form of an application-specific IC (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked.

The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
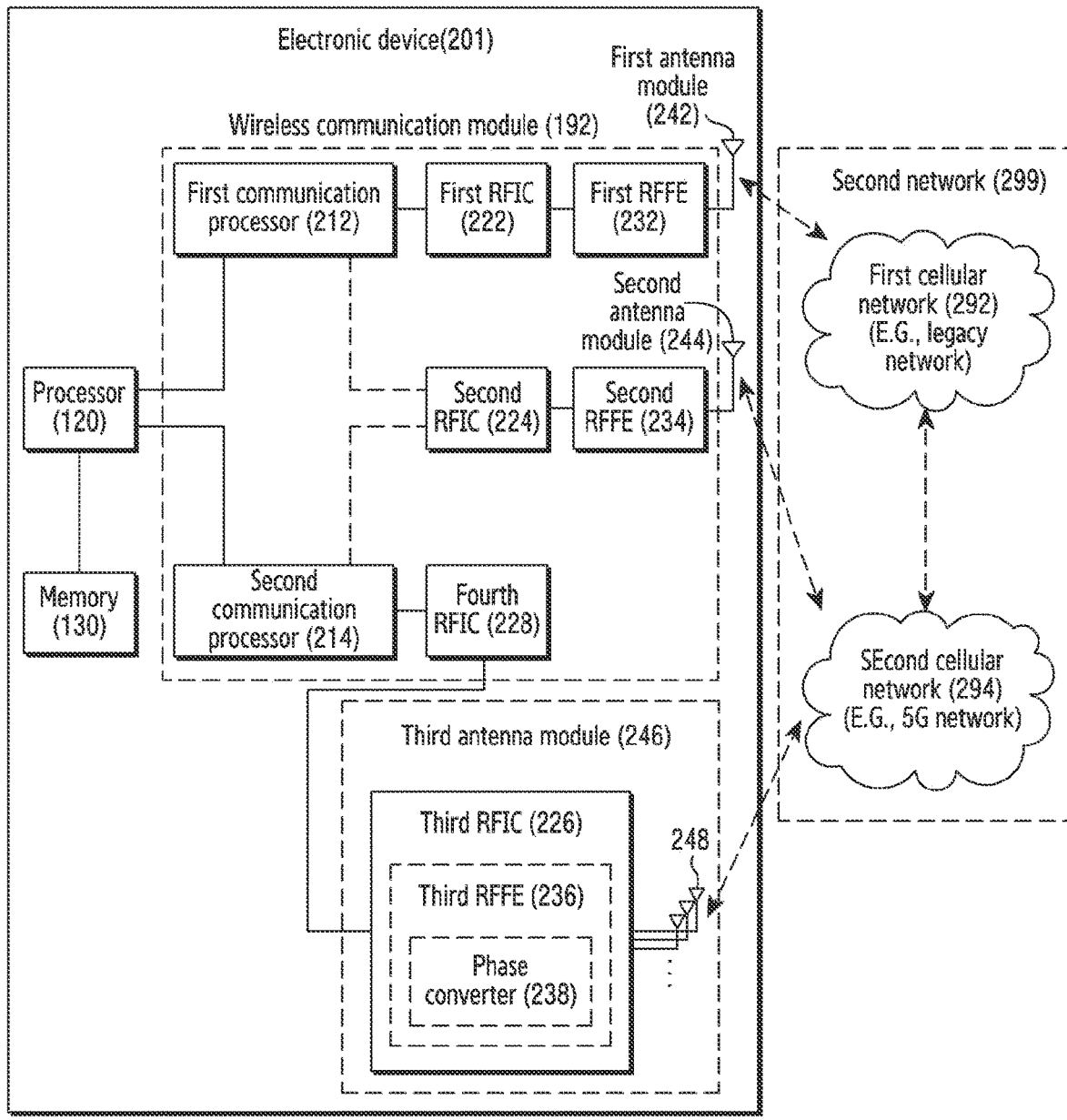
FIG. 2 illustrates an electronic device that support multiple frequency bands according to an embodiment.

FIG. 2 illustrates an electronic device that supports multiple frequency bands according to an embodiment.

Referring to FIG. 2, the electronic device 201 includes a first communication processor 212, a second communication processor 214, a first RFIC 222, a second RFIC 224, a third RFIC 226, a fourth RFIC 228, a first RFFE 232, a second RFFE 234, a first antenna module 242, a second antenna module 244, and antennas 248. The electronic device 101 further includes a processor 120 and a memory 130. A second network 299 includes a first cellular network 292 and a second cellular network 294. Alternatively, the electronic device 201 may further include at least one of the components illustrated in FIG. 1, and the second network 299 may further include at least another network. The first communication processor 212, the second communication processor 214, the first RFIC 222, the second RFIC 224, the fourth RFIC 228, the first RFFE 232, and the second RFFE 234 configure at least a part of the wireless communication module 192. Alternatively, the fourth RFIC 228 may be omitted or may be included as a part of the third RFIC 226.

The first communication processor 212 may support establishment of a communication channel of a band to be used for wireless communication with the first cellular communication network 292, and legacy network communication via the established communication channel. The first cellular network 292 may be a legacy network including a second generation (2G), third generation (3G), fourth generation (4G), or long term evolution (LTE) network. The second communication processor 214 may support establishment of a communication channel corresponding to a designated band (e.g., about 6 GHz to about 60 GHz) among bands to be used for wireless communication with the second cellular network 294, and 5G network communication via the established communication channel. The second cellular network 294 may be a fifth generation (5G) network defined by 3rd generation partnership project (3GPP). In addition, the first communication processor 212 or the second communication processor 214 may support establishment of a communication channel corresponding to another designated band (e.g., about 6 GHz or lower) among the bands to be used for wireless communication with the second cellular network 294, and 5G network communication via the established communication channel. The first communication processor 212 and the second communication processor 214 may be implemented in a single chip or a single package. Alternatively, the first communication processor 212 or the second communication processor 214 may be configured, in a single chip or a single package, together with the processor 120, an auxiliary processor 123, or the communication module 190. The first communication processor 212 and the second communication processor 214 may be directly or indirectly connected to each other by an interface, in order to provide or receive data or a control signal in either or both directions.

The first RFIC 222 may convert, during transmission, a baseband signal generated by the first communication processor 212 into an RF signal of about 700 MHz to about 3 GHz used for the first cellular network 292 (e.g., a legacy network). During reception, the RF signal may be acquired from the first cellular network 292 via the first antenna module 242 and may be preprocessed via the first RFFE 232. The first RFIC 222 may convert the preprocessed RF signal into a baseband signal to be processed by the first communication processor 212.

The second RFIC 224 may convert, during transmission, a baseband signal generated by the first communication processor 212 or the second communication processor 214 into an RF signal (e.g., a 5G Sub6 RF signal) of a Sub6 band (e.g., about 6 GHz or lower) used for the second cellular network 294 (e.g., 5G network). During reception, the 5G Sub6 RF signal may be acquired from the second cellular network 294 via the second antenna module 244 and may be preprocessed via the second RFFE 234. The second RFIC 224 may convert the preprocessed 5G Sub6 RF signal into a baseband signal to be processed by the first communication processor 212 or the second communication processor 214.

The third RFIC 226 may convert a baseband signal generated by the second communication processor 214 into an RF signal (e.g., a 5G Above6 RF signal) of a 5G Above6 band (e.g., about 6 GHz to about 60 GHz) to be used for the second cellular network 294. During reception, the 5G Above6 RF signal may be acquired from the second cellular network 294 via the antenna 248 and may be preprocessed via the third RFFE 236. The third RFIC 226 may convert the preprocessed 5G Above6 RF signal into a baseband signal to be processed by the second communication processor 214. The third RFFE 236 may be configured as a part of the third RFIC 226.

The electronic device 201 may include the fourth RFIC 228 separately from or as at least a part of the third RFIC 226. In this case, the fourth RFIC 228 may convert a baseband signal generated by the second communication processor 214 into an RF signal (e.g., an intermediate frequency (IF) signal) of an IF band (e.g., about 9 GHz to about 11 GHz), and then may transfer the IF signal to the third RFIC 226. The third RFIC 226 may convert the IF signal into a 5G Above6 RF signal. During reception, the 5G Above6 RF signal may be received from the second cellular network 294 via the antenna 248 and may be converted to an IF signal by the third RFIC 226. The fourth RFIC 228 may convert the IF signal into a baseband signal to be processed by the second communication processor 214.

The first RFIC 222 and the second RFIC 224 may be implemented as a single chip or at least part of a single package. The first RFFE 232 and the second RFFE 234 may be implemented as a single chip or at least part of a single package. Alternatively, at least one of the first antenna module 242 or the second antenna module 244 may be omitted, or may be combined with another antenna module in order to process RF signals in a plurality of corresponding bands.

The third RFIC 226 and the antenna 248 may be disposed on the same substrate in order to configure a third antenna module 246. For example, the wireless communication module 192 or the processor 120 may be disposed on a first substrate (e.g., a main PCB). In this case, the third RFIC 226 may be disposed in a partial area (e.g., a bottom surface) of a second substrate (e.g., a sub-PCB) separate from the first substrate, and the antenna 248 may be disposed in another area partial area (e.g., a top surface), thereby configuring the third antenna module 246. By placing the third RFIC 226 and the antenna 248 on the same substrate, it is possible to reduce the length of a transmission line therebetween. This configuration may reduce the loss (e.g., attenuation) of a signal, which is caused due to a transmission line, in a high frequency band (e.g., about 6 GHz to about 60 GHz) used for 5G network communication. Accordingly, the electronic device 201 may improve the quality or speed of communication with the second cellular network 294.

The antennas 248 may be configured by an antenna array including a plurality of antenna elements for beamforming. In this case, the third RFIC 226 may include a plurality of phase shifters 238 corresponding to the plurality of antenna elements, as a part of the third RFFE 236. During transmission, each of the plurality of phase shifters 238 may convert the phase of a 5G Above6 RF signal to be transmitted to the outside (e.g., base station of the 5G network) of the electronic device 201 via a corresponding antenna element. During reception, each of the plurality of phase shifters 238 may convert the phase of the 5G Above6 RF signal received from the outside via the corresponding antenna element, into the same or substantially the same phase. Accordingly, transmission or reception may be performed via beamforming between the electronic device 201 and the outside.

Each of or at least one of the first to third RFFEs 232, 234, and 236 may include a protection device and/or a method for preventing an internal power amplifier from burning out due to frequency unlocking of a local oscillation signal generated by a local oscillator for supplying overcurrent or frequency mixing. The protection device may recognize that the frequency of the local oscillation signal is unlocked by sensing that the frequency of the local oscillation signal is out of a frequency band designated for transmission of a transmission signal.

Although FIG. 2 illustrates an example in which the electronic device 201 includes three RFFs 232, 234, and 236, the protection device and/or the method therefore according to various proposed embodiments may be applied regardless of the number of RFFEs included in the electronic device 201.

The second cellular network 294 may be operated independently of (e.g., stand-alone (SA) or in connection with (e.g., non-stand-alone (NSA)) the first cellular network 292. For example, the 5G network may have only an access network (e.g., 5G radio access network (RAN) or next generation RAN (NG RAN)) and may not have a core network (e.g., next generation core (NGC)). In this case, the electronic device 201 may access the access network of the 5G network, and then may access an external network (e.g., Internet) under the control of a core network (e.g., evolved packet core (EPC)) of the legacy network. Protocol information (e.g., LTE protocol information) for communication with the legacy network or protocol information (e.g., new radio (NR) protocol information) for communication with the 5G network may be stored in the memory 130, and may be accessed by other components (e.g., the processor 120, the first communication processor 212, or the second communication processor 214).

The processor 120 of the electronic device 201 may execute one or more instructions stored in the memory 130. The processor 120 may include a circuit for data processing, for example, at least one of an IC, an arithmetic logic unit (ALU), a field programmable gate array (FPGA), and large scale integration (LSI). The memory 130 may store data related to the electronic device 201. The memory 130 may include a volatile memory, such as a random access memory (RAM) including a static random access memory (SRAM), a dynamic RAM (DRAM), etc., or may include a non-volatile memory, such as a flash memory, an embedded multimedia card (eMMC), a solid state drive (SSD), etc., as well as a read only memory (ROM), a magneto-resistive RAM (MRAM), a spin-transfer torque MRAM (STT-MRAM), a phase-change RAM (PRAM), a resistive RAM (RRAM), and a ferroelectric RAM (FeRAM).

The memory 130 may store instructions related to an application and instructions related to an OS. The OS is system software executed by the processor 120. The processor 120 may manage hardware components included in the electronic device 201 by executing the operating system. The operating system may provide an application programming interface (API) to applications that are software other than the system software.

One or more applications, which are a set of multiple instructions, may be installed in the memory 130. Installation of an application in the memory 130 may indicate that the application is stored in a format executable by the processor 120 connected to the memory 130.

Figure 3:
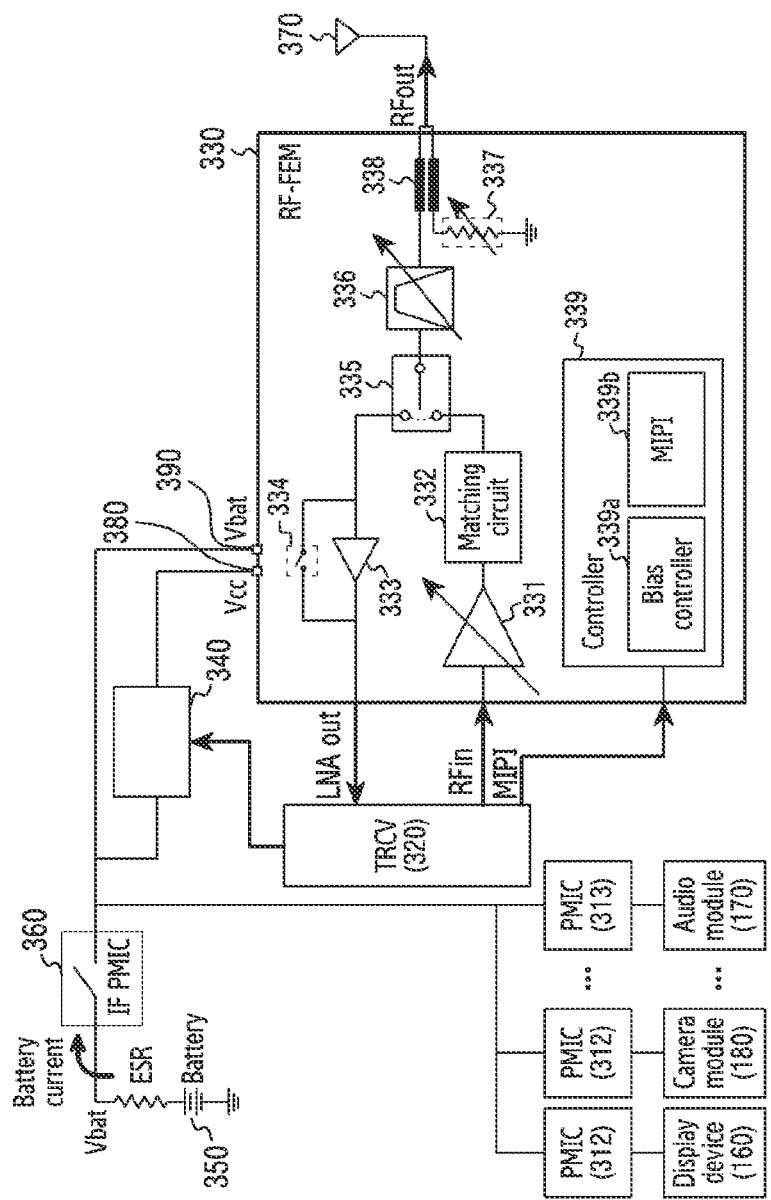
FIG. 3 illustrates a circuit for processing an RF signal in an electronic device using a battery as a power source according to an embodiment.

FIG. 3 illustrates a circuit for processing an RF signal in an electronic device using a battery as a power source according to an embodiment.

Referring to FIG. 3, an electronic device includes antenna 370, an RF transceiver (TRCV) 320, and an RF-front end module (FEM) 330. A driving voltage Vcc and a bias voltage Vbat may be supplied to components in the RF-FEM 330 as operation power. The driving voltage Vcc may be supplied to a Vcc node (terminal or port) 380, and the bias voltage Vbat may be supplied to a Vbat node (terminal or port) 390.

The RF TRCV 320 may process RF signals for transmission and/or reception.

The RF TRCV 320 may convert a baseband signal into an RF signal (RFin) for transmission, or may convert a received RF signal (LNA out) into a baseband signal. The RF TRCV 320 may include a digital-to-analog converter (DAC)/analog-to-digital converter (ADC), a mixer, and/or an oscillator.

The RF-FEM 330 may process RF signals. The RF-FEM 330 includes a power amplifier 331, a matching circuit 332, an LNA 333, a bypass switch 334, a transmission/reception switch 335, a filter 336, a variable resistor 337, a coupler 338 and a controller 339.

The power amplifier 331 may amplify an RF signal transmitted from the RF TRCV 320. The power amplifier 331 may include two or more power amplifiers connected in series in order to increase an amplification factor and maintain linearity. The matching circuit 332 may produce load impedance. The LNA 333 may amplify RF signals received through the antenna. The bypass switch 334 may be used to produce a reception path that does not use the LNA 333. The transmission/reception switch 335 may connect a transmission path including the power amplifier 331 to the filter 336 when transmitting signals. The transmission/reception switch 335 may connect a reception path including the LNA 333 to the filter 336 when receiving signals. The filter 336 may filter signals according to a frequency band of the signal used for communication. The variable resistor 337 may provide a resistance value required for the operation of the coupler 338. The coupler 338 may perform coupling of transmission signals and reception signals.

The controller 339 may generate a control signal for controlling at least one element included in the RF-FEM 330. The controller 339 includes a bias controller 339a for controlling the bias current of the power amplifier 331 and a MIPI 339b for exchanging signals with at least one element included in the RF-FEM 330.

The battery 350 may supply current required for the operation of the respective modules (e.g., a display device, a camera module, an audio module, the RF TRCV 320, the RF-FEM 330, etc.) in the electronic device.

The PMIC 360 may manage the overall power of the electronic device. The PMIC 360 may manage power such that current supplied from the battery 350 may flow through the respective modules. The electronic device 101 also includes separate power management ICs (PMICs) 311, 312, and 313 for managing power such that a constant level of current may be stably supplied to some and/or all of the internal modules.

The power amplifier 331 of the RF-FEM 330 may receive a bias voltage Vbat from the battery 350 without the aid of the PMICs 311, 312, and 313. The RF-FEM 330 may need to generate a high output, and thus should provide a sufficient bias current to the power amplifier 331. However, when it is not possible to provide a sufficient bias current for the high output by passing through the PMICs 311, 312, and 313, the battery 350 may be directly connected the power amplifier 331 without the PMICs 311, 312, and 313.

The driving voltage Vcc supplied to the power amplifier 331 may be supplied by a driving power source of an envelope tracking IC (ETIC) (not shown) or envelope tracking modulator (ETM) 340. For convenience, the description below assumes that the driving power source of the ETM 340 supplies the driving voltage Vcc to the power amplifier 331. However, the embodiments in the disclosure may also be applied when a driving power source of the ETIC supplies the driving voltage Vcc to the power amplifier 331 in the same manner. The ETM 340 may change the driving voltage Vcc supplied to the power amplifier 331 depending on the envelop of an RF signal to be transmitted. In this case, the electronic device 101 may reduce the power consumed for transmission.

The controller 339 may control at least one element included in the RF-FEM 330. e.g., based on a control signal (MIPI control signal) provided from the RF TRCV 320. The controller 339 may be configured to tune the state of at least one of the power amplifier 331, the matching circuit 332, or the filter 336, based on a connected network or a mode of used power. The controller 339 may measure the performance or characteristics (e.g., linearity or efficiency) of the RF-FEM 330 while the RF-FEM 330 is installed and operated in the electronic device. The controller 339 may measure the performance or characteristics of the RF-FEM 330 using a signal coupled by the coupler 338. The controller 339 may be referred to as a "control block", a "sensing circuit", a "sensing and control block", a "sensing and control circuit", or other terms having similar technical meanings.

Figure 4:
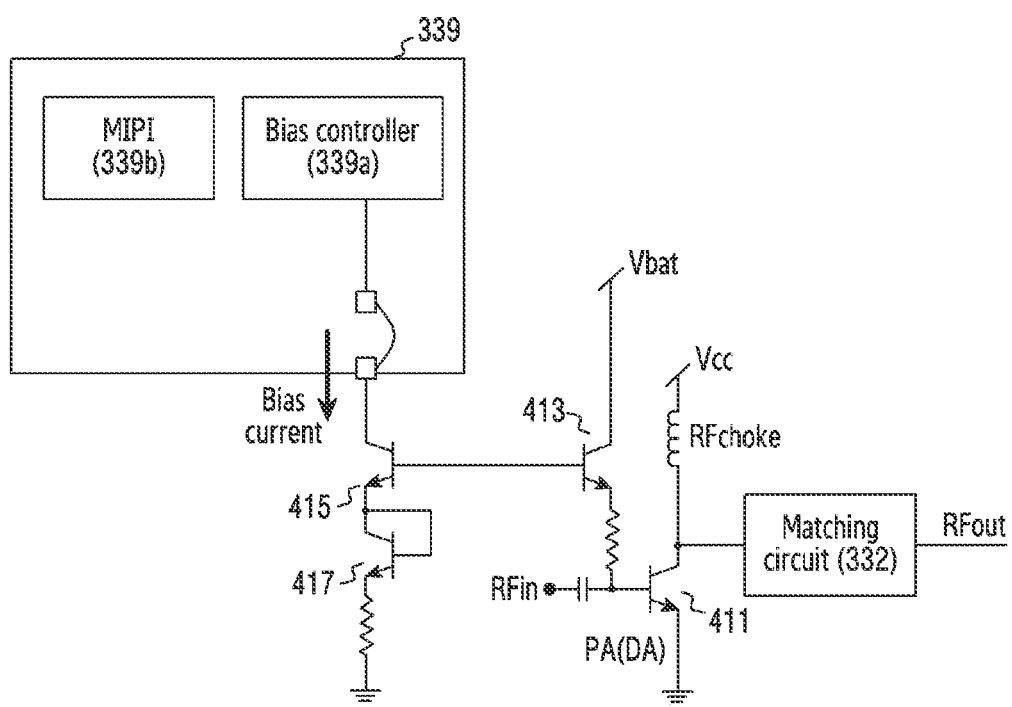
FIG. 4 illustrates a power amplifier provided in an electronic device according to an embodiment.

FIG. 4 illustrates a power amplifier provided in an electronic device according to an embodiment.

Referring to FIG. 4, a controller 339 includes a bias controller 339a and an MIPI 339b. A power amplifier 431 includes a plurality of internal transistors 411, 413, 415, and 417, a matching circuit 332, and a plurality of passive elements (e.g., resistors, inductors, etc.).

The bias controller 339a may output bias current for switching the internal transistors 411, 413, 415, and 417 of the power amplifier 431 to produce a path connecting an input terminal with an output terminal. The bias controller 339a may output bias current for switching the internal transistors 411, 413, 415, and 417 such that an input signal RFin is input to the input terminal and is output as an output signal RFout from the output terminal by passing through the matching circuit 332. Also, the bias controller 339a may not output the bias current in order to block the path connecting the input terminal to which the input signal RFin is input and the output terminal from which the output signal RFout is output. If the path connecting the input terminal and the output terminal is blocked, the input signal RFin to the input terminal may not be output as the output signal RFout from the output terminal.

In order to amplify a large magnitude of input signal RFin, a large amount of current must be supplied in proportion thereto to the base end of the transistor 411. In order to maintain the signal amplification level and/or linearity in the power amplifier 431, a constant bias current must be supplied. Accordingly, the current flowing through the base end of the transistor 411 may be supplied from the circuit in which a bandgap circuit and a low-dropout (LDO) regulator are combined. The current flowing in the base end of the transistor 411 may be produced by a rectified reference voltage. However, the LDO regulator may be unable to supply enough current due to design limitations. Accordingly, the bias controller 339a including a band gap circuit may be used to consistently supply a reference bias current so that current may be stably supplied to the base end of the bias current transistor 413 of the power amplifier 431. The reference bias current may be several milliamperes (mA) or less.

The power amplifier 431 may receive most of the bias current from a battery through the Vbat node using the reference bias current. The bias current may be tens of mA or less. The power amplifier 431 may receive most of the current used for amplification operation through the Vcc node connected to the ETM 340.

The power amplifier 431 may burn out, however, when overcurrent flows therethrough or overvoltage is applied thereto. The burnout may indicate that some or all of power cells of the power amplifier 431 are damaged due to flow of current, which is greater than the intensity that the power amplifier 431 is able to handle. If some or all of the power cells of the power amplifier 431 are damaged, the damaged parts may be connected to the ground or the resistance may become infinite, so that the input signal RFin may not be transformed to the output signal RFout.

As an example, overcurrent may flow through the power amplifier 431 due to a malfunctioning switch. Overcurrent may flow through the power amplifier 431 if a switch is turned off while the power amplifier 431 is amplifying a signal, if a reception path is connected due to a malfunction of a switch, if the impedance of the power amplifier 431 with respect to an antenna becomes infinite, or if a high voltage standing wave ratio (VSWR) is provided. The impedance of the power amplifier 431 with respect to the antenna may become infinite, if the power amplifier 431 is connected to the filter having different characteristics of frequency.

As another example, overcurrent may flow through the power amplifier 431 due to a frequency shift phenomenon of the input signal RFin to the power amplifier 431. For example, when the power amplifier 431 is configured to perform amplification in a frequency band corresponding to band 25 (1850 MHz to 1915 MHz), if the frequency of the input signal RFin is shifted to 1950 MHz, overcurrent may flow because a high voltage standing wave ratio is provided.

An overcurrent protection circuit may be used to prevent the power amplifier 431 from burning out due to the overcurrent that may be caused by the reasons described above.

Figure 5:
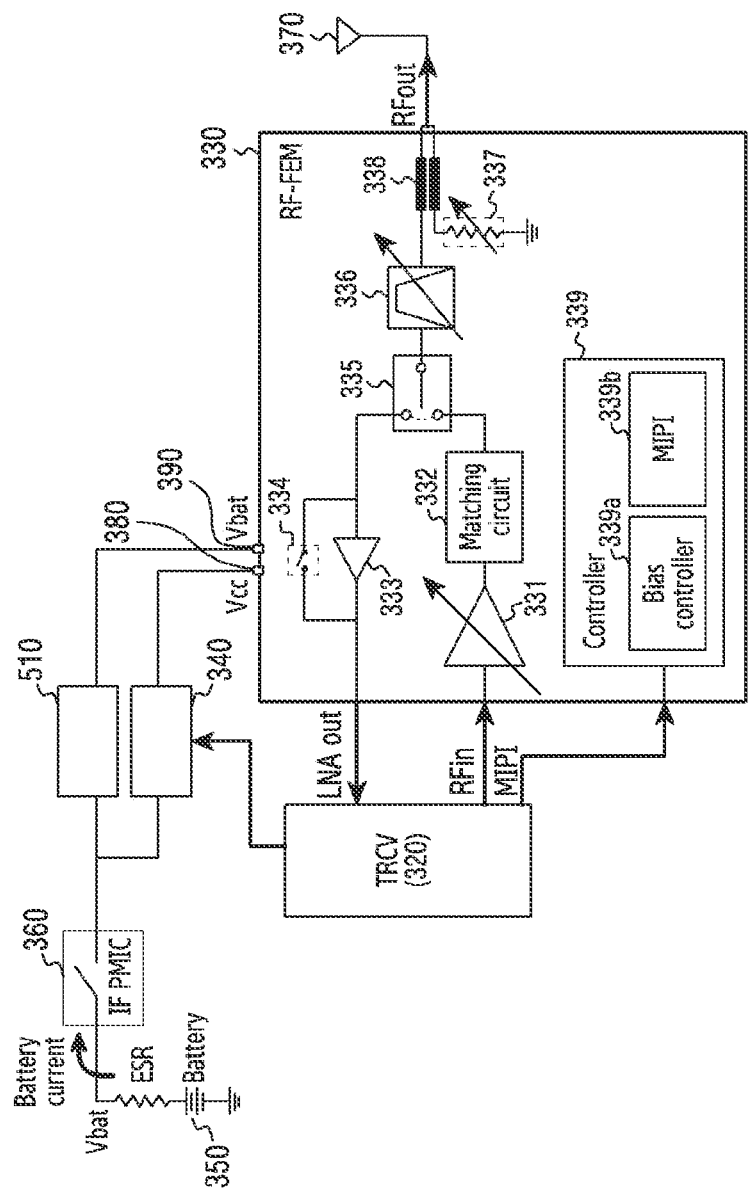
FIG. 5 illustrates a protection circuit provided in an electronic device according to an embodiment.

FIG. 5 illustrates an overcurrent protection circuit provided in an electronic device according to an embodiment.

Referring to FIG. 5, an overcurrent protection circuit 510 is positioned between the PMIC 360 and the Vbat node 390 of the RF-FEM 330. The overcurrent protection circuit 510 may be configured separately from the ETM 340, or may be configured as a single package with the same. The overcurrent protection circuit 510 may operate based on the current flowing by the voltage Vbat supplied from the battery 350 through the PMIC 360 (hereinafter, referred to as "Vbat current"). The voltage Vbat to be supplied from the battery 350 to an internal module, such as the RF-FEM 330, may be managed by the PMIC 360.

If an operation voltage of the power amplifier 331 is supplied from the PMIC 360, the overcurrent protection circuit 510 may monitor the level of the Vbat current, thereby recognizing the flow of overcurrent. The overcurrent protection circuit 510 may recognize the flow of overcurrent in the power amplifier 331 using a preconfigured threshold value (e.g., a reference current value). The flow of overcurrent may be recognized when the Vbat current is greater than or equal to a preconfigured threshold value (e.g., a reference current value).

Alternatively, the overcurrent protection circuit 510 may be positioned between the ETM 340 and the Vcc node 380 of the RF-FEM 330. In this case, the overcurrent protection circuit 510 may operate based on the current flowing by the voltage Vcc generated by the ETM 340 (hereinafter, referred to as "Vcc current"). For example, if an operation voltage of the power amplifier 331 is supplied from the PMIC 360, the overcurrent protection circuit 510 may monitor the level of the Vcc current, thereby recognizing the flow of overcurrent.

Since the Vbat current is about 1/100 of the Vcc current, it may be more efficient to operate the overcurrent protection circuit 510, based on the Vbat current.

Figure 6:
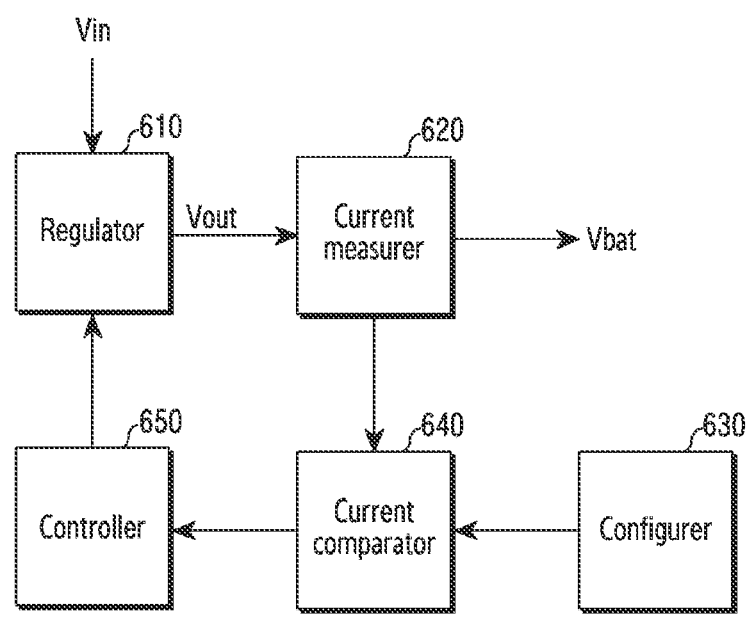
FIG. 6 illustrates an overcurrent protection circuit for a power amplifier according to an embodiment.

FIG. 6 illustrates an overcurrent protection circuit for a power amplifier according to an embodiment.

Referring to FIG. 6, the overcurrent protection circuit, which prevents burnout of a power amplifier due to overcurrent, includes a regulator 610, a current measurer 620, a configurer 630, a current comparator 640, and a controller 650. Alternatively, the controller 650 may include the configurer 630 and the current comparator 640.

The regulator 610 may supply a constant level of output voltage Vout using an input voltage Vin. The input voltage Vin may be supplied from a battery. The output voltage Vout may be used to apply a constant level of current for the power amplifier.

The regulator 610 may be turned on/off by a control signal from the outside, for example, a control signal from the controller 650. The regulator 610 may output the output voltage Vout (an on state) or block the same (an off state) in response to a control signal from the controller 650. For example, the regulator 610 may be an LDO regulator.

The regulator 610 may be replaced by a power switch that may be turned on/off in response to a control signal. If the power switch is turned on, an input port to which the input voltage Vin is applied may be connected to an output port from which the output voltage Vout is output. If the power switch is turned off, an input port to which the input voltage Vin is applied may be disconnected from the output port from which the output voltage Vout is output.

The regulator 610 may control the level of current in response to the control of the controller 650. For example, the regulator 610 may tune a reference voltage Vref in response to the control of the controller 650, or may control the level of current by forcibly fixing the bias current.

The output voltage Vout supplied from a power switch or the regulator 610 may be connected to the Vbat port (node or terminal) of the RF-FEM, and may supply the bias voltage Vbat to the power amplifier.

The current measurer 620 may measure the level or magnitude of the bias current capable of flowing through the power amplifier due to the bias voltage Vbat. The current measurer 620 may measure the bias current using the current flowing through the internal resistance of the power amplifier by the supply of the bias voltage Vbat.

The configurer 630 may configure a maximum permissible current value (or a current level) permitted in the power amplifier. The maximum permissible current value may be specified as a range of the bias current permitted by the power amplifier in consideration of burnout. The range of the bias current may be defined by an upper current limit value and/or a lower current limit value. Hereinafter, for convenience of description, the current value and the current level will be collectively referred to as a "current value".

An electronic device may include a plurality of power amplifiers. In this case, the maximum permissible current values of the respective power amplifiers may be configured in consideration of the usage conditions of the power amplifiers. The maximum permissible current values permitted in the plurality of power amplifiers may be different from each other.

The configurer 630 may configure the maximum permissible current value of the power amplifier. The maximum permissible current value of an electronic device that has already been sold or will be sold may be renewed based on software updates in order to prevent burnout of the power amplifier. For example, the maximum permissible current value may be updated if burnout occurs in at least one power amplifier included in an electronic device. The configurer 630 may prevent additional burnout by newly configuring the maximum permissible current value. The maximum permissible current value may be used as a reference current value in order to determine whether or not the bias current applied to at least one power amplifier is excessive.

The current value measured by the current measurer 620 may be provided to the current comparator 640. The current comparator 640 may compare the maximum permissible current value provided from the configurer 630 with the bias current value measured by the current measurer 620, and may provide a result of the comparison to the controller 650.

The controller 650 may control the operation of the power switch or the regulator 610, based on the comparison result provided from the current comparator 640. For example, if it is recognized that a bias current value greater than the maximum permissible current value is measured based on the comparison result, the controller 650 may output a control signal for turning off the power switch or the regulator 610. In this case, the power switch or the regulator 610 may stop generating the bias voltage Vbat. or may limit the bias voltage Vbat or the bias current Ibat. If the bias voltage Vbat is not generated by the power switch or the regulator 610, the bias current Ibat (or the Vbat current) flowing to the current measurer 620 may be restricted. Accordingly, it is possible to prevent the power amplifier from burning out due to overcurrent, by blocking the voltage as soon as the overcurrent flows through the power amplifier.

Figure 7:
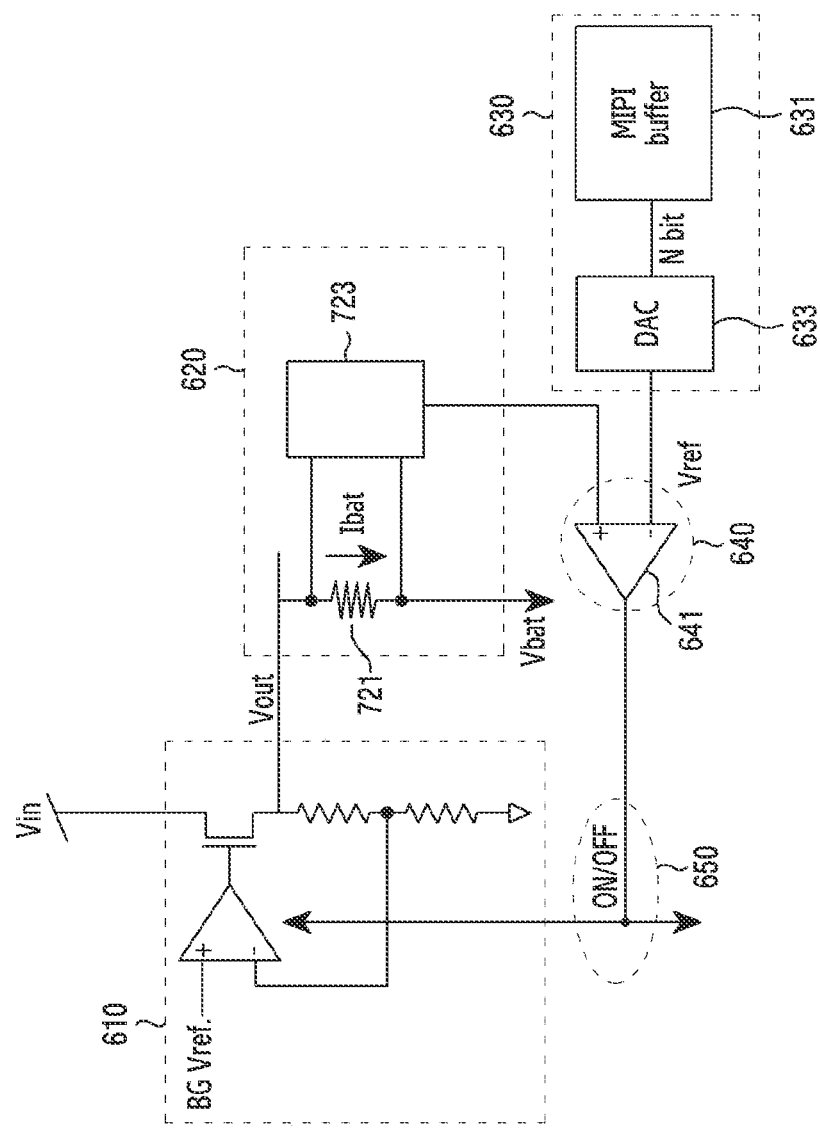
FIG. 7 illustrates an overcurrent protection circuit for a power amplifier according to an embodiment.

FIG. 7 illustrates an overcurrent protection circuit for a power amplifier according to an embodiment.

Referring to FIG. 7, the overcurrent protection circuit includes a regulator 610, a current measurer 620, a configurer 630, a current comparator 640, and/or a controller 650. The current measurer 620 includes a resistor 721 and a detector 723. The resistor 721 may be connected in series to the output port Vout of the regulator 610. The detector 723 may be one of a current detector or a voltage detector. If the detector 723 is a current detector, the current detector may detect the magnitude of the current Ibat (e.g., a current value or a current level) flowing through the resistor 721. If the detector 723 is a voltage detector, the voltage detector may detect the magnitude of voltage Vbat (e.g., a voltage value or a voltage level) applied to the resistor 721. The detector 723 may obtain the magnitude of the current Ibat (e.g., a value or a level thereof) flowing through the resistor 721 in consideration of the detected magnitude of the voltage Vbat and the resistance value of the resistor 721. In this case, the detector 723 may be equipped with a separate configuration for obtaining the magnitude of the current Ibat (e.g., a value or a level thereof) in addition to the voltage detector. If the detector 723 is a voltage detector, the current measurer 620 may define a mapping relationship between voltage values and current values using a look-up table, and may obtain a current value corresponding to the detected voltage value using the look-up table.

The configurer 630 includes a buffer 631 supporting the MIPI, e.g., an MIPI buffer, a complex programmable logic device (CPLD), or an FPGA, and/or a DAC converter 633. The maximum permissible current value configured by a processor may be stored in the MIPI buffer 631 included in the configurer 630. The maximum permissible current value stored in the MIPI buffer 631 may be provided to the DAC 633 included in the configurer 630. The DAC 633 may convert an N-bit digital value corresponding to the maximum permissible current value into an analog value Vref. and may output the converted analog value Vref.

The current comparator 640 may compare a measurement value measured by the current measurer 620 with the maximum permissible current value provided from the configurer 630. The current comparator 640 may output a value corresponding to the result of comparing the measured current value with the analog value Vref corresponding to the maximum permissible current value. The current comparator 640 includes, for example, a comparator 641 for comparing the measured current value with the maximum permissible current value.

The current comparator 640 may output logic "high" if the measured current value is greater than the maximum permissible current value, and may output logic "low" if the measured current value is less than the maximum permissible current value. Alternatively, the current comparator 640 may output logic "low" if the measured current value is greater than the maximum permissible current value, and may output logic "high" if the measured current value is less than the maximum permissible current value.

The controller 650 may transfer the output of the current comparator 640 to the regulator 610. For example, the regulator 610 may be turned on in response to an input logic of "high", and may be turned off in response to an input logic of "low". The regulator 610 may tune the value of the bias current supplied to an RF-FEM in response to the input logic of "high" or "low". In this case, the regulator 610 may reduce the value of the bias current supplied to the RF-FEM to a predetermined level in response to the input of logic "high", or may maintain or reduce the value of the bias current supplied to the RF-FEM to a predetermined level in response to the input of logic "low".

Figure 8:
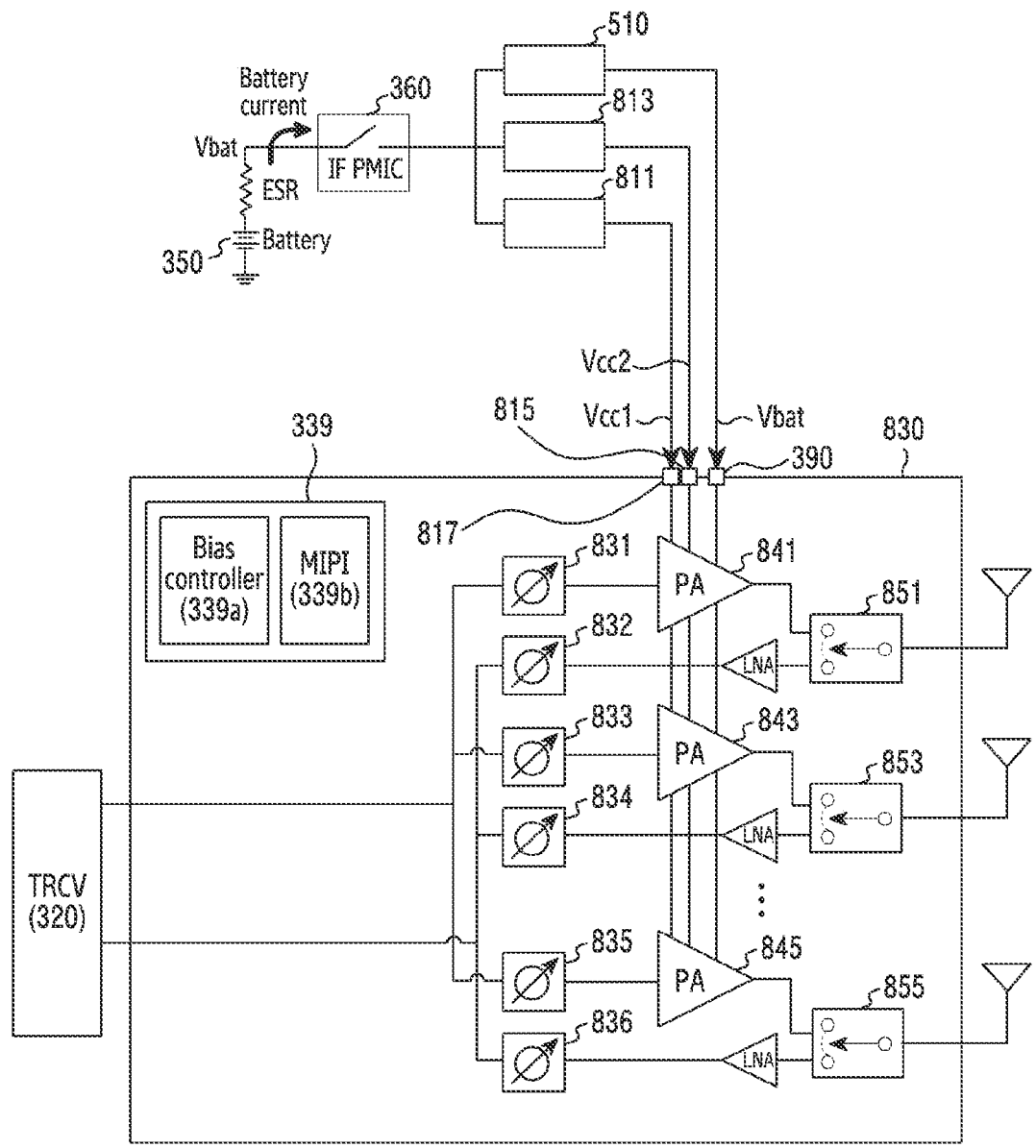
FIG. 8 illustrates an overcurrent protection circuit provided in an electronic device according to an embodiment.

FIG. 8 illustrates an overcurrent protection circuit provided in an electronic device according to an embodiment.

Referring to FIG. 8, an RF-FEM 830, which may support beamforming, includes a plurality of phase converters 831 to 836 and/or a plurality of power amplifiers 841, 843, and 845 for beamforming. The plurality of power amplifiers 841, 843, and 845 included in the RF-FEM 830 may be connected in series.

When two power amplifiers are connected in series, voltage Vcc1 generated by a first ETM 811 may be supplied as driving power to a first power amplifier, among the two power amplifiers connected in series, through a Vcc1 terminal 817, and voltage Vcc2 generated by a second ETM 813 may be supplied as driving power to a second power amplifier, among the two power amplifiers connected in series, through a Vcc2 terminal 815.

Alternatively, when two power amplifiers are connected in series, one of voltage Vcc1 generated by the first ETM 811 and voltage Vcc2 generated by the second ETM 813 may be supplied as driving power to all of the two power amplifiers connected in series through a Vcc port. In this case, the first ETM 811 and the second ETM 813 may be configured in parallel.

The battery voltage may be supplied as a bias voltage Vbat to the plurality of power amplifiers 841, 843, and 845 after passing through the overcurrent protection circuit 510.

A time division duplex (TDD) operation may be performed in mmWave, and thus switches 851, 853, and 855 may be connected to the output ports of the plurality of power amplifiers 841, 843, and 845 in implementing a transmission path and a reception path. In this case, overcurrent may flow through the power amplifier due to a malfunction or incorrect control of the switches 851, 853 and 855. The overcurrent may burn out one of the power amplifiers 841, 843, and 845. In order to eliminate the possibility of burning out one of the power amplifiers 841, 843, and 845, the overcurrent protection circuit 510 may be applied. The overcurrent protection circuit 510, the first ETM 811, and the second ETM 813 may be implemented as a single configuration.

The driving voltage and the maximum permissible current value of a power amplifier used in 6 GHz or less may be different from the driving voltage and the maximum permissible current value of the power amplifier for mmWave. In this case, a configurer of the overcurrent protection circuit 510 may configure the maximum permissible current value according to a permissible current value of the power amplifier depending on the used frequency band.

Figure 9:
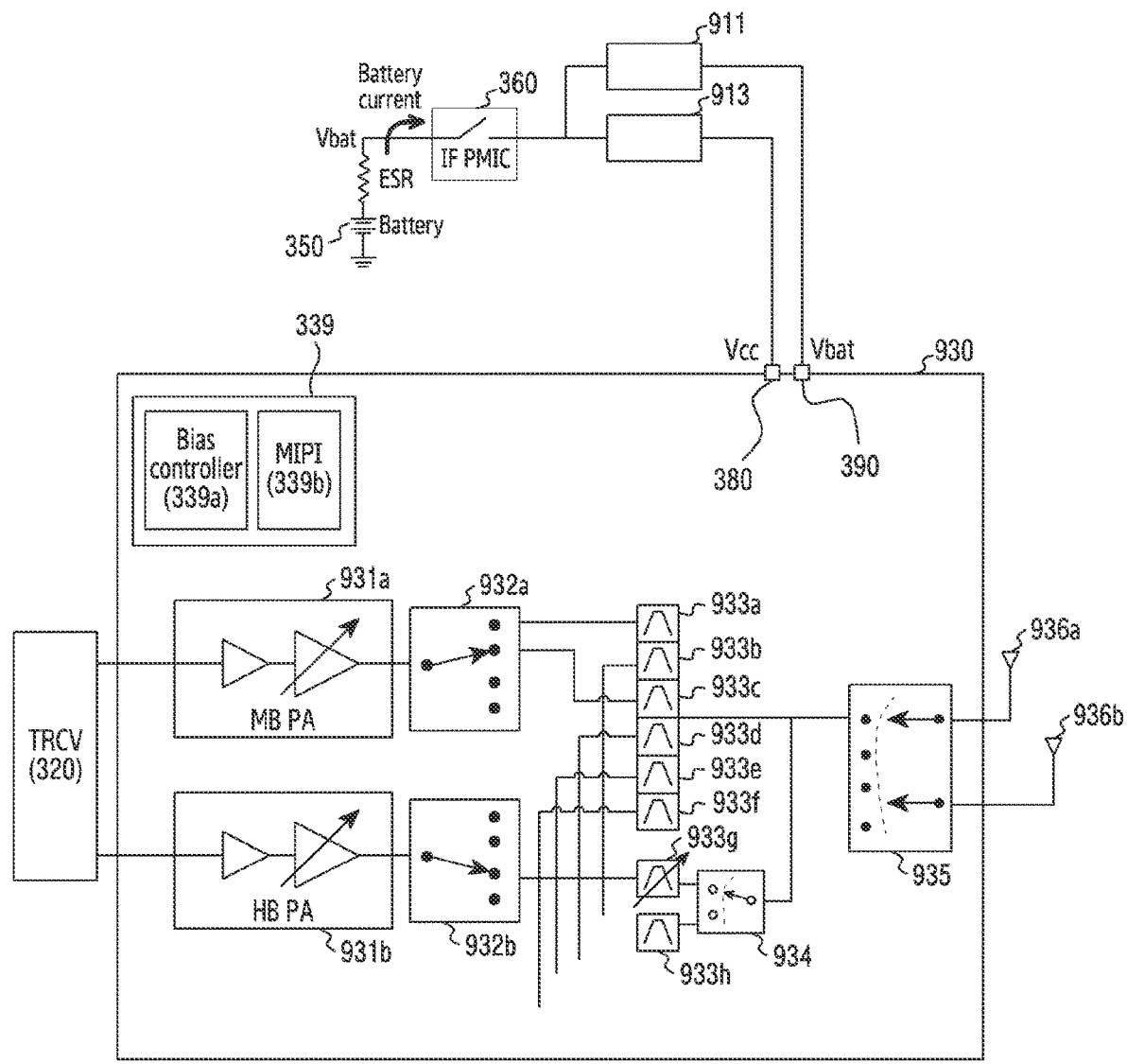
FIG. 9 illustrates an overcurrent protection circuit provided in an electronic device according to an embodiment.

FIG. 9 illustrates an overcurrent protection circuit provided in an electronic device according to an embodiment.

Referring to FIG. 9, the RF-FEM 930, which may support a plurality of bands, includes a middle band (MB) power amplifier 931a, a high band (HB) power amplifier 931b, an MB switch 932a, an HB switch 932b, a plurality of filters 933a to 933h, a filter switch 934, and an antenna switch 935.

The MB power amplifier 931a may amplify and output an intermediate band signal. The HB power amplifier 931b may amplify and output a high frequency band signal.

The MB switch 932a may transmit the output of the MB power amplifier 931a to one of the plurality of filters 933a to 933h. The HB switch 932b may transmit the output of the HB power amplifier 931b to one of the plurality of filters 933a to 933h. The plurality of filters 933a to 933h may include a plurality of filters 933a to 933f for MBs and a plurality of filters 933g and 933h for HBs.

If a plurality of filters 933a to 933h are provided for respective frequency bands, the MB switch 932a may transmit the output of the MB power amplifier 931a to one of the plurality of filters 933a to 933f for MBs, and the HB switch 932b may transmit the output of the HB power amplifier 931b to one of the plurality of filters 933g and 933h for HBs.

The filter switch 934 may transmit the output of one of the plurality of filters 933g and 933h for HBs to the input port of the antenna switch 935. The antenna switch 935 may provide the output (e.g., a filtered RF signal) of one of the plurality of filters 933a to 933f for MBs or the filter switch 934 to at least one of the plurality of antennas 936a and 936b.

The RF-FEM 930 includes a plurality of power amplifiers 931a and 931b and a plurality of switches 932a, 932b, 934, and 935. The output ports of the plurality of power amplifiers 931a and 931b may be connected to at least one of the plurality of switches 932a, 932b, 934, and 935. The output signals of the power amplifiers 931a and 931b may be reflected by at least one of the plurality of switches 932a, 932b, 934, and 935, thereby burning out the power amplifiers.

Voltage Vcc generated by the ETM 913 may be supplied as a driving voltage to two connected power amplifiers 931a and 931b through the Vcc terminal 380. The bias voltage Vbat supplied by the overcurrent protection circuit 911 may be supplied as a bias voltage to the two connected power amplifiers 931a and 931b through the Vbat terminal 390.

The overcurrent protection circuit 911 may detect that overcurrent flows through the power amplifiers 931a and 931b, thereby stopping or adjusting the supply of the bias voltage Vbat. The overcurrent protection circuit 911 may detect overcurrent flowing using the bias current of the power amplifiers 931a and 931b due to the bias voltage Vbat. The overcurrent protection circuit 911 may stop or adjust the supply of the bias voltage Vbat to prevent the power amplifier from being burnt out.

If the power amplifiers 931a and 931b have different frequency characteristics, the maximum permissible amount of current may be different between the power amplifiers 931a and 931b. Therefore, a configurer of the overcurrent protection circuit 911 may detect overcurrent using the maximum permissible amount of current of the power amplifier to be used. The overcurrent protection circuit 911 and the ETM 913 may be implemented as a single configuration.

Figure 10:
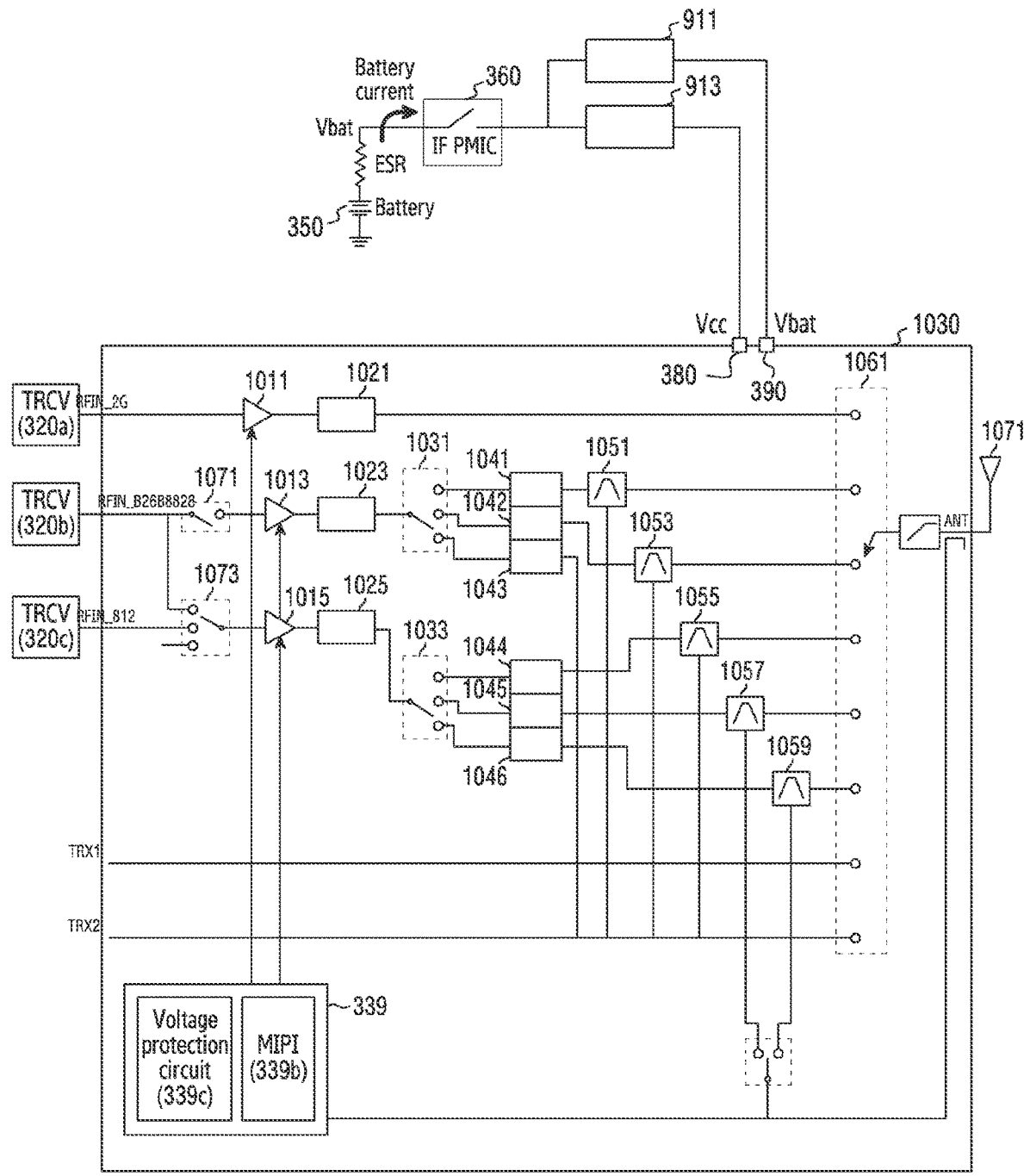
FIG. 10 illustrates an overcurrent protection circuit provided in an electronic device according to an embodiment.

FIG. 10 illustrates an overcurrent protection circuit provided in an electronic device according to an embodiment.

Referring to FIG. 10, an RF-FEM 1030, which may support a plurality of bands, includes power amplifiers 1011, 1013, and 1015, first matching circuits 1021, 1023, and 1025, switches 1031 and 1033, second matching circuits 1041 to 1046, a plurality of duplexers or filters 1051, 1053, 1055, 1057, and 1059, and a switch 1061.

The power amplifiers 1011, 1013, and 1015 may amplify at least one RF input signal. The output ports of the power amplifiers 1011, 1013, and 1015 may be connected to one of the first matching circuits 1021, 1023, and 1025. Some matching circuits 1023 and 1025, among the first matching circuits 1021, 1023, and 1025, may be connected to the input port of one of the switches 1031 and 1033. The output ports of the switches 1031 and 1033 may be connected to the input port of one of the second matching circuits 1041 to 1046.

The output ports of the second matching circuits 1041 to 1046 may be connected to the input ports of corresponding duplexers or filters among the plurality of duplexers or filters 1051, 1053, 1055, 1057, and 1059. The plurality of duplexers or filters 1051, 1053, 1055, 1057, and 1059 may filter signals input from the second matching circuits 1041 to 1046 such that only the RF signal in a required frequency band may be transmitted.

The output port of the remaining matching circuit 1021 among the matching circuits 1021, 1023, and 1025, or the output ports of the plurality of duplexers or filters 1051, 1053, 1055, 1057, and 1059 may be connected to the input port of the switch 1061. The switch 1061 may select one of the output of the remaining matching circuit 1021 or the outputs of the plurality of duplexers or filters 1051, 1053, 1055, 1057, and 1059. The RF signal selected by the switch 1061 may be radiated through the antenna 1071 after passing through another filter.

The RF-FEM 1030 may receive RF signals in different frequency bands. The RF signals in different frequency bands may be provided by a unique TRCV. A signal RFIN_1 in a first frequency band, which is output from a first TRCV 320a, may be provided to a first power amplifier 1011 in the RF-FEM 1030. A signal RFIN_2 in a second frequency band, which is output from a second TRCV 320b, may be provided to one of a second power amplifier 1013 or a third power amplifier 1015 in the RF-FEM 1030. A signal RFIN_3 in a third frequency band, which is output from a third TRCV 320c, may be provided to the third power amplifier 1015.

A switch 1071 may switch the output of the second TRCV 320b into the input of the second power amplifier 1013. Another switch 1073 may switch one of three inputs, i.e., the output of the second TRCV 320b, the output of the third TRCV 320c, and an open port, into the input of the third power amplifier 1015. Here, an "open port", which is one of the inputs of the other switch 1073, may indicate that there is no input signal. One of the first to third TRCVs 320a, 320b, and 320c may transmit RF signals in different frequency bands to a plurality of power amplifiers 1011, 1013, and 1015 through a plurality of RF ports.

The output ports of the power amplifiers 1011, 1013, and 1015 may be connected to at least one of the plurality of switches 1031, 1033, and 1061. Accordingly, the output signals of the power amplifiers 1011, 1013, and 1015 may be reflected by at least one connected switch among the plurality of switches 1031, 1033, and 1061. The signal reflected by at least one switch may burn out the power amplifier.

The overcurrent protection circuit 911 may detect that overcurrent flows through the power amplifiers 1011, 1013, and 1015, and may block or limit the bias voltage Vbat supplied to the power amplifiers 1011, 1013, and 1015 in consideration of a result thereof. The bias voltage Vbat may be limited by adjusting (reducing or increasing) a voltage level or a voltage value thereof.

The power amplifiers 1011, 1013, and 1015 having different characteristics of frequency may have different maximum permissible amounts of current depending on their characteristics of frequency. Therefore, the configurer 630 of the overcurrent protection circuit 911 may detect overcurrent using the maximum permissible amount of current available for a corresponding power amplifier.

The overcurrent protection circuit 911 may determine whether or not overcurrent flows through the power amplifier in consideration of the bias voltage Vbat. and may block or limit the bias voltage Vbat supplied to the power amplifier, based on a result of the determination. For example, limiting the bias voltage Vbat may correspond to increasing or reducing the level or value of the bias voltage Vbat.

The overcurrent protection circuit 911 may include a configurer for configuring the maximum permissible current values. The configurer may actively configure the maximum permissible current values depending on the characteristics of frequency of the power amplifiers. The maximum permissible current values may be used to operate the overcurrent protection circuit for the plurality of power amplifiers 1011, 1013, and 1015 in the electronic device.

As described above with reference to FIGS. 8 to 10, an electronic device may prevent one or more power amplifiers provided therein from burning out by using at least one overcurrent protection circuit.

When two or more current amplifiers, capable of simultaneously operating, are connected to one overcurrent protection circuit, the smaller value of the maximum permissible current values of the two or more current amplifiers may be used as a final maximum permissible current value. As another example, when each of two or more current amplifiers capable of simultaneously operating is connected to one overcurrent protection circuit, the maximum permissible current value may be used independently for each of the two or more current amplifiers.

A plurality of power amplifiers provided in an electronic device may have different current limit values, based on a frequency band of an RF signal amplified by each of the power amplifiers and the structures of circuits connected to the front and the rear. In order to prevent a plurality of power amplifiers having different current limit values from burning out due to overcurrent using one overcurrent protection circuit, the overcurrent protection circuit may employ a configurer, and may generate a reference current Vref as the current limit value corresponding to the currently used power amplifier. For example, the electronic device may dynamically configure a reference current Vref according to the current limit value corresponding to the currently used power amplifier. The current limit values corresponding to the respective power amplifiers may be stored in a memory.

Figure 11:
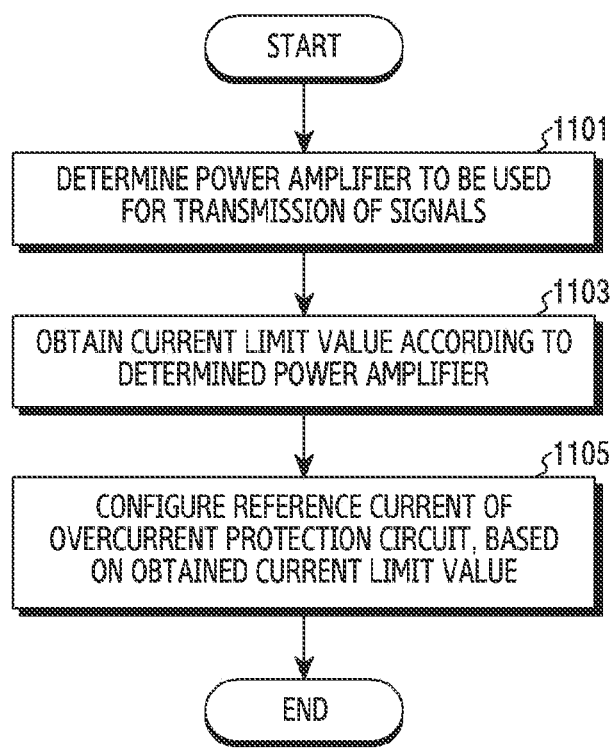
FIG. 11 is a flowchart illustrating of a method performed by an electronic device to protect an internal circuit from overcurrent according to an embodiment.

FIG. 11 illustrates a method performed by an electronic device to protect an internal circuit from overcurrent according to an embodiment.

Referring to FIG. 11, in step 1101, the electronic device determines a power amplifier, among one or more power amplifiers, to be used for transmission of signals.

Since the power amplifiers simultaneously operate in order to operate as an array antenna, the electronic device may determine to use some or all of the power amplifiers, as described above with reference to FIG. 8.

The electronic device may determine one of an MB power amplifier or an HB power amplifier, based on whether the frequency band of the RF signal to be transmitted is an intermediate band or a high frequency band, as described above with reference to FIG. 9.

The electronic device may determine at least one power amplifier among a plurality of power amplifiers, based on a wireless communication scheme selected to transmit RF signals, as described above with reference to FIG. 10.

In step 1103, the electronic device obtains at least one current limit value (e.g., the maximum permissible current value) according to the one or more determined power amplifiers. If it is determined that a plurality of power amplifiers is to be used, the electronic device may obtain the minimum current limit value, among the current limit values for the respective power amplifiers, as the current limit value. The current limit values according to the respective power amplifiers may be stored in a memory. The electronic device may change the current limit values according to all or each of the one or more power amplifiers through update. If an event occurs, in which one of the electronic devices of the same product burns out due to overcurrent, the current limit value, which is currently used, may be determined to be inappropriate. In this case, the current limit value may be updated using a new value (e.g., a value less than the current limit value being used). For example, the update may be performed when the electronic device of the same product is updated. The electronic device may receive a new current limit value from a server when updating an OS or software, and may change the value stored in the memory. This may prevent burnout of the power amplifiers included in other electronic devices. Alternatively, the electronic device may obtain an event indicating that burnout of a power amplifier has occurred from a server when updating an OS or software, and may reduce the current limit value, which is currently configured, by a preconfigured ratio (e.g., 0.1) in response to the obtained event. The electronic device may reduce the current limit value by the above operation, thereby preventing burnout of the power amplifier.

In step 1105, the electronic device 101 may configure reference current of the overcurrent protection circuit, based on the obtained current limit value. In this case, a processor may transmit the current limit value obtained based on an MIPI protocol to a configurer of the overcurrent protection circuit. The MIPI of the configurer and a DAC may convert the received current limit value to an analog value, thereby generating reference current Vref.

Accordingly, the electronic device may actively configure the current limit value according to the power amplifier to be used, thereby preventing one or more of a plurality of power amplifiers included in the electronic device from burning out due to overcurrent using one overcurrent protection circuit.

According to the above-described embodiments, it is possible to prevent power amplifiers included in an electronic device from burning out due to overcurrent or overvoltage. In addition, it is possible to collectively prevent burnout of multiple power amplifiers in an electronic device by a single overcurrent protection circuit.

While the disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

An Example 1 of the present disclosure may be an electronic device with features at least one power amplifier (e.g., the power amplifier 331 shown in FIG. 5) configured to amplify a transmission signal; a battery (e.g., the battery 350 shown in FIG. 5) configured to provide a bias voltage to the at least one power amplifier; and an overcurrent protection circuit (e.g., the overcurrent protection circuit 510 shown in FIG. 5) configured to prevent overcurrent from flowing through the at least one power amplifier, wherein the overcurrent protection circuit comprises: a configurer (e.g., the configurer 630 shown in FIG. 6) configured to configure a reference current value, based on the at least one power amplifier; a measurer (e.g., the current measurer 620 shown in FIG. 6) configured to measure a bias current value due to the bias voltage; a comparator (e.g., the current comparator 640 shown in FIG. 6) configured to compare the measured bias current value with the reference current value; and a controller (e.g., the controller 650) configured to recognize overcurrent flowing through the at least one power amplifier and control provision of the bias voltage, based on a result of the comparison.

An Example 2 may be an electronic device in accordance with example 1, or with any other example described herein, wherein the electronic device further comprises a regulator (e.g., the regulator 610 shown in FIG. 6) configured to receive, from the controller, a control signal for controlling the bias voltage, and block the bias voltage from being provided to the power amplifier in response to the received control signal, or adjust a bias current level of the power amplifier.

An Example 3 may be an electronic device in accordance with example 1 or example 2, or with any other example described herein, wherein the electronic device further comprises a switch configured to: receive, from the controller, a control signal for controlling the bias voltage, and supply power as the bias voltage from the battery or shut off the supply of power as the bias voltage from the battery.

An Example 4 may be an electronic device in accordance with any one of example 1 to 3, or with any other example described herein, wherein the configurer is further configured to actively change the reference current value, based on characteristics of frequency of the power amplifier to which the bias voltage is to be supplied.

An Example 5 may be an electronic device in accordance with any one of example 1 to 4, or with any other example described herein, wherein the electronic device further comprises a driving power source configured to provide a driving voltage for driving the power amplifier, based on the power supplied from the battery, wherein the overcurrent protection circuit and the driving power source are configured as a single package.

An Example 6 may be an electronic device in accordance with any one of example 1 to 5, or with any other example described herein, wherein the electronic device further comprises a processor operably connected to the overcurrent protection circuit; and a memory operably connected to the processor, wherein the memory stores instructions that, when executed, cause the processor to: determine the power amplifier to which the bias voltage is to be supplied, among a plurality of power amplifiers included in the electronic device; obtain a maximum permissible current value according to the determined power amplifier; and control the configurer to configure the reference current value, based on the obtained maximum permissible current value.

An Example 7 may be an electronic device in accordance with any one of example 1 to 6, or with any other example described herein, wherein the controller is further configured to, if the determined power amplifier is in an overcurrent state, based on the comparison result, transmit a signal indicating that the determined power amplifier is in the overcurrent state to the processor, and wherein the instructions, when executed, cause the processor to reset the electronic device in response to reception of the signal indicating that the determined power amplifier is in the overcurrent state.

An Example 8 may be an electronic device in accordance with any one of example 1 to 7, or with any other example described herein, wherein the instructions, when executed, cause the processor to: determine the power amplifier to which the bias voltage is to be supplied, among the plurality of power amplifiers included in the electronic device, based on a frequency band for transmitting the transmission signal or a wireless communication scheme selected to transmit the transmission signal, and if the determined power amplifier, to which the bias voltage is to be supplied, is changed, change the reference current value, based on the changed power amplifier.

An Example 9 may be an electronic device in accordance with any one of example 1 to 8, or with any other example described herein, wherein if a plurality of power amplifiers is provided, the configurer is configured to configure the reference current value, based on the minimum current limit value among current limit values according to the respective power amplifiers.

An Example 10 may be an electronic device in accordance with any one of example 1 to 9, or with any other example described herein, wherein the electronic device further comprises a memory configured to store the current limit values according to the respective power amplifiers.

An Example 11 may be an electronic device in accordance with any one of example 1 to 10, or with any other example described herein, wherein the at least one power amplifier comprises a first power amplifier and a second power amplifier, wherein the overcurrent protection circuit is connected to the first power amplifier and the second power amplifier, and wherein the current supplied to the first power amplifier and the second power amplifier is controlled by the overcurrent protection circuit.

An Example 12 of the present disclosure may be a method for protecting a power amplifier from overcurrent in an electronic device (e.g., the electronic device 101 shown in FIG. 1), the method comprising: determining a power amplifier to which a bias voltage and a driving voltage are to be supplied, among a plurality of power amplifiers (e.g., the power amplifiers 831, 832, 833, 834, 835, 836 shown in FIG. 8) included in the electronic device; obtaining a maximum permissible current value according to the determined power amplifier; and configuring a reference current value of an overcurrent protection circuit (e.g., the overcurrent protection circuit 510 shown in FIG. 5), based on the obtained maximum permissible current value.

An Example 13 may be a method in accordance with example 12, or with any other example described herein, wherein the method further comprises receiving, from the overcurrent protection circuit, a signal indicating that the power amplifier is in an overcurrent state; and resetting the electronic device in response to reception of the signal.

An Example 14 may be a method in accordance with example 12 or example 13, or with any other example described herein, wherein, if the at least one power amplifier comprises at least two power amplifiers, the obtaining of the maximum permissible current value according to the at least one power amplifier comprises obtaining a minimum maximum permissible current value as the maximum permissible current value according to the at least one power amplifier, from among maximum permissible current values according to the at least two power amplifiers.

An Example 15 may be a method in accordance with example 12 to 14, or with any other example described herein, wherein the method further comprises storing a maximum permissible current value according to each of the plurality of power amplifiers (e.g., the power amplifiers 831, 832, 833, 834, 835, 836 shown in FIG. 8) in the memory (e.g., the memory 130 shown in FIG. 1), the obtaining of the maximum permissible current value according to the at least one power amplifier comprises obtaining the maximum permissible current value corresponding to the at least one power amplifier from the memory (e.g., the memory 130 shown in FIG. 1).

An Example 16 may be a method in accordance with any one of example 12 to 15, or with any other example described herein, wherein determining of the at least one power amplifier to which the bias voltage and the driving voltage are to be supplied, among the plurality of power amplifiers (e.g., the power amplifiers 831, 832, 833, 834, 835, 836 shown in FIG. 8) included in the electronic device, comprises determining the at least one amplifier to which the bias voltage and the driving voltage are to be supplied, among the plurality of power amplifiers (e.g., the power amplifiers 831, 832, 833, 834, 835, 836 shown in FIG. 8), based on a frequency band to transmit a transmission signal or a wireless communication scheme selected to transmit a transmission signal.

An Example 17 may be a method in accordance with any one of example 12 to 16, or with any other example described herein, wherein the method further comprises if the at least one power amplifier, to which the bias voltage and the driving voltage are to be supplied, is changed, changing the reference current value, based on the at least one changed power amplifier.

The overcurrent protection circuit according to various examples in the disclosure described above, when it is determined that the current flowing through the power amplifier exceeds a predetermined value or more, may stop the supply of the bias voltage, thereby preventing burnout of the power amplifier.

In addition, the overcurrent protection circuits according to various examples may actively configure a current value to be limited so as to conform to the characteristics of each of a plurality of power amplifiers in the electronic device, thereby preventing burnout of a plurality of power amplifiers having different characteristics from each other.

An example of the present disclosure provides an electronic device comprising a at least one power amplifier configured to amplify a transmission signal, a battery configured to provide a bias voltage to the at least one power amplifier and an overcurrent protection circuit configured to prevent overcurrent from flowing through the power amplifier, wherein the overcurrent protection circuit comprises: configure means for configuring a reference current value, based on the power amplifier; measure means for measuring a bias current value due to the bias voltage; compare means for comparing the measured bias current value with the reference current value; and control means for recognizing overcurrent flowing through the power amplifier and controlling provision of the bias voltage, based on a result of the comparison. The scope of protection is defined by the appended independent claims. Further features are specified by the appended dependent claims. Example implementations can be realized comprising one or more features of any claim taken jointly and severally in any and all permutations.

The methods according to the embodiments described in the claims or specification of the disclosure may be implemented in the form of hardware, software, or a combination of hardware and software.

In the case of implementing the embodiments in software, a computer-readable storage medium, which stores one or more programs (software modules), may be provided. One or more programs stored in a computer-readable storage medium are configured for execution by one or more processors in an electronic device. The one or more programs include instructions that cause the electronic device to execute methods according to the embodiments described in the claims or specification of the disclosure.

These programs (software modules or software) may be stored in random access memory, non-volatile memory including flash memory, read only memory (ROM), electrically erasable programmable read only memory (EEPROM), a magnetic disc storage device, compact disc-ROM (CD-ROM), digital versatile discs (DVDs) or other types of optical storage devices, or a magnetic cassette. Alternatively, the programs may be stored in a memory configured as a combination of some or all thereof. In addition, a plurality of memories may be configured.

In addition, the programs may be stored in an attachable storage device that can be accessed through a communication network, such as the Internet, an intranet, a local area network (LAN), a wide LAN (WLAN), or a storage area network (SAN), or a communication network configured as a combination thereof.

Such a storage device may access the device that performs an embodiment of the disclosure through an external port. In addition, a separate storage device in the communication network may access the device that performs an embodiment of the disclosure.

The scope of protection is defined by the appended independent claims. Further features are specified by the appended dependent claims. Example implementations can be realized comprising one or more features of any claim taken jointly and severally in any and all permutations.

The examples described in this disclosure include non-limiting example implementations of components corresponding to one or more features specified by the appended independent claims and these features (or their corresponding components) either individually or in combination may contribute to ameliorating one or more technical problems deducible by the skilled person from this disclosure.

Furthermore, one or more selected component of any one example described in this disclosure may be combined with one or more selected component of any other one or more example described in this disclosure, or alternatively may be combined with features of an appended independent claim to form a further alternative example.

Further example implementations can be realized comprising one or more components of any herein described implementation taken jointly and severally in any and all permutations. Yet further example implementations may also be realized by combining features of one or more of the appended claims with one or more selected components of any example implementation described herein.

In forming such further example implementations, some components of any example implementation described in this disclosure may be omitted. The one or more components that may be omitted are those components that the skilled person would directly and unambiguously recognize as being not, as such, indispensable for the function of the present technique in the light of a technical problem discernible from this disclosure. The skilled person would recognize that replacement or removal of such an omitted components does not require modification of other components or features of the further alternative example to compensate for the change. Thus further example implementations may be included, according to the present technique, even if the selected combination of features and/or components is not specifically recited in this disclosure.

Two or more physically distinct components in any described example implementation of this disclosure may alternatively be integrated into a single component where possible, provided that the same function is performed by the single component thus formed. Conversely, a single component of any example implementation described in this disclosure may alternatively be implemented as two or more distinct components to achieve the same function, where appropriate.

In the specific embodiments of the disclosure described above, elements included in the disclosure have been expressed in a singular or plural form according to the presented specific embodiments. However, the singular or plural expression is selected appropriately for the situation presented for convenience of description, and the disclosure is not limited to the singular or plural elements, and even elements expressed in a plural form may be configured as a single element, and vice versa.

Meanwhile, although specific embodiments have been described in the detailed description of the disclosure, various modifications are possible without departing from the scope of the disclosure. Therefore, the scope of the disclosure should not be determined to be limited to the described embodiments, and should be determined by the scope of the claims to be described later and equivalents thereto.

The invention claimed is:
1. An electronic device, comprising:
a power amplifier for amplifying a transmission signal;
a battery for providing a bias voltage to the power amplifier; and
an overcurrent protection circuit for preventing overcurrent from flowing through the power amplifier,
wherein the overcurrent protection circuit is configured to:
configure a reference current value, based on the power amplifier,
actively change the reference current value, based on characteristics of frequency of the power amplifier to which the bias voltage is to be provided,
measure a bias current value due to the bias voltage,
compare the measured bias current value with the reference current value,
recognize overcurrent flowing through the power amplifier, and
control provision of the bias voltage, based on a result of the comparison.

2. The electronic device of claim 1, wherein the overcurrent protection circuit comprises a controller and a regulator, and
wherein the regulator is configured to:
receive, from the controller, a control signal for controlling the bias voltage, and
block the bias voltage from being provided to the power amplifier in response to the received control signal, or adjust a bias current level of the power amplifier.

3. The electronic device of claim 1, wherein the overcurrent protection circuit comprises a controller and a switch, and
wherein the switch is configured to:
receive, from the controller, a control signal for controlling the bias voltage, and
provide power as the bias voltage from the battery or shut off provision of power as the bias voltage from the battery.

4. The electronic device of claim 1, wherein the reference current value is configured based on a frequency of the power amplifier to which the bias voltage is to be provided, and
wherein the reference current value is actively changed based on the frequency of the power amplifier.

5. The electronic device of claim 1, further comprising a driving power source for providing a driving voltage for driving the power amplifier, based on a power provided from the battery,
wherein the overcurrent protection circuit and the driving power source are configured as a single package.

6. The electronic device of claim 1, further comprising:
one or more processors; and
memory that stores instructions that, when executed by the one or more processors, cause the electronic device to:
determine the power amplifier to which the bias voltage is to be provided, among a plurality of power amplifiers included in the electronic device,
obtain a maximum permissible current value according to the determined power amplifier, and
configure the reference current value, based on the obtained maximum permissible current value.

7. The electronic device of claim 6, wherein the overcurrent protection circuit is further configured to:
in case that the determined power amplifier is in an overcurrent state, transmit a signal indicating that the determined power amplifier is in the overcurrent state to the one or more processors, and
wherein the instructions, when executed, cause the one or more processors to reset the electronic device in response to reception of the signal indicating that the determined power amplifier is in the overcurrent state.

8. The electronic device of claim 6, wherein the instructions, when executed, cause the electronic device to:
determine the power amplifier to which the bias voltage is to be provided, among the plurality of power amplifiers included in the electronic device, based on a frequency band for transmitting the transmission signal or a wireless communication scheme selected to transmit the transmission signal, and
in case that the determined power amplifier, to which the bias voltage is to be provided, is changed, change the reference current value, based on the changed power amplifier.

9. The electronic device of claim 1, further comprising:
memory; and
at least one additional power amplifier,
wherein the memory is configured to store current limit values, and
wherein the overcurrent protection circuit is further configured to configure the reference current value, based on a minimum current limit value among the current limit values according to each of the power amplifiers of the electronic device.

10. The electronic device of claim 1, further comprising a second power amplifier,
wherein the overcurrent protection circuit is connected to the power amplifier and the second power amplifier, and
wherein current provided to the power amplifier and the second power amplifier is controlled by the overcurrent protection circuit.

11. A method for protecting a power amplifier from overcurrent in an electronic device, the method comprising:
determining a power amplifier to which a bias voltage and a driving voltage are to be provided, among a plurality of power amplifiers included in the electronic device;
obtaining a maximum permissible current value according to the determined power amplifier;
configuring a reference current value of an overcurrent protection circuit, based on the obtained maximum permissible current value; and
actively changing the reference current value, based on characteristics of frequency of the determined power amplifier.

12. The method of claim 11, further comprising:
identifying that the power amplifier is in an overcurrent state; and
resetting the electronic device in response to the power amplifier being in the overcurrent state.

13. The method of claim 11, wherein, in case that the determined power amplifier comprises at least two power amplifiers, obtaining the maximum permissible current value according to the power amplifier comprises identifying a minimum value among maximum permissible current values according to the at least two power amplifiers as the maximum permissible current value.

14. The method of claim 11, wherein determining the power amplifier to which the bias voltage and the driving voltage are to be provided, among the plurality of power amplifiers included in the electronic device, comprises determining the power amplifier to which the bias voltage and the driving voltage are to be provided, among the plurality of power amplifiers, based on a frequency band to transmit a transmission signal or a wireless communication scheme selected to transmit a transmission signal.

15. The method of claim 11, further comprising, in case that the power amplifier, to which the bias voltage and the driving voltage are to be provided, is changed, changing the reference current value, based on the changed power amplifier.

16. An electronic device, comprising:
a power amplifier for amplifying a transmission signal;
a battery for providing a voltage for driving the power amplifier; and
an overcurrent protection circuit for shutting off or limiting provision of power from the battery to the power amplifier, in case that an overcurrent is recognized,
wherein the overcurrent protection circuit is configured to:
configure a reference current value, based on the power amplifier to which a driving voltage is being provided or is to be provided from the battery, actively change the reference current value, based on characteristics of frequency of the power amplifier, measure current provided by the driving voltage, compare the measured current with the reference current value, determine that the power amplifier is in an overcurrent state, based on a result of the comparison, and in case that the power amplifier is in an overcurrent state, transmit a control signal for shutting off or limiting provision of the driving voltage to a driving power source.

17. An electronic device, comprising:

a plurality of power amplifiers for amplifying a transmission signal;

a battery for providing a bias voltage to at least one power amplifier among the plurality of power amplifiers;

an overcurrent protection circuit for preventing overcurrent from flowing through the at least one power amplifier; and at least one processor configured to:
  determine the at least one power amplifier to which the bias voltage is to be provided among the plurality of power amplifier, and
  obtain a maximum permissible current value based on the determined at least one power amplifier, wherein the overcurrent protection circuit is configured to:
  configure a reference current value, based on the maximum permissible current value,
  measure a bias current value due to the bias voltage,
  compare the measured bias current value with the reference current value,
  recognize overcurrent flowing through the at least one power amplifier, and
  control provision of the bias voltage, based on a result of the comparison.

18. The electronic device of claim 17, wherein the overcurrent protection circuit comprises a controller and a regulator, and wherein the regulator is configured to:
  receive, from the controller, a control signal for controlling the bias voltage, and
  block the bias voltage from being provided to the at least one power amplifier in response to the received control signal, or adjust a bias current level of the at least one power amplifier.

19. The electronic device of claim 17, wherein the overcurrent protection circuit comprises a controller and a switch, and wherein the switch is configured to:
  receive, from the controller, a control signal for controlling the bias voltage, and
  provide power as the bias voltage from the battery or shut off provision of power as the bias voltage from the battery.

20. The electronic device of claim 17, further comprising a driving power source for providing a driving voltage for driving the plurality of power amplifiers, based on a power provided from the battery, wherein the overcurrent protection circuit and the driving power source are configured as a single package.

* * * * *